United States Patent
Dokumaci et al.

(10) Patent No.: US 6,841,826 B2
(45) Date of Patent: Jan. 11, 2005

(54) LOW-GIDL MOSFET STRUCTURE AND METHOD FOR FABRICATION

(75) Inventors: Omer H. Dokumaci, Wappingers Falls, NY (US); Bruce B. Doris, Brewster, NY (US); Oleg Gluschenkov, Wappingers Falls, NY (US); Jack A. Mandelman, Flat Rock, NC (US); Carl J. Radens, LaGrangeville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/345,472

(22) Filed: Jan. 15, 2003

(65) Prior Publication Data

US 2004/0137689 A1 Jul. 15, 2004

(51) Int. Cl.[7] .................. H01L 29/76; H01L 29/94; H01L 31/062; H01L 21/336; H01L 29/49
(52) U.S. Cl. .................. 257/336; 257/344; 257/389; 257/900; 257/E21.422; 257/E21.421; 257/E29.152; 257/E29.133
(58) Field of Search ................ 257/389, 387, 257/412, 344, 336, 333, 324, 340

(56) References Cited

U.S. PATENT DOCUMENTS

| | | | |
|---|---|---|---|
| 4,714,519 A | 12/1987 | Pfiester | |
| 5,091,763 A | 2/1992 | Sanchez | |
| 5,108,939 A | * 4/1992 | Manley et al. | 438/594 |
| 5,210,435 A | * 5/1993 | Roth et al. | 257/344 |
| 5,256,585 A | 10/1993 | Bae | |
| 5,256,586 A | 10/1993 | Choi et al. | |
| 5,314,834 A | * 5/1994 | Mazure et al. | 438/301 |
| 5,877,058 A | * 3/1999 | Gardner et al. | 438/304 |
| 6,090,671 A | 7/2000 | Balasubramanyam et al. | |
| 6,090,693 A | 7/2000 | Gonzalez et al. | |
| 6,097,069 A | 8/2000 | Brown et al. | |
| 6,097,070 A | * 8/2000 | Mandelman et al. | 257/389 |
| 6,100,143 A | 8/2000 | Brown et al. | |
| 6,200,839 B1 | * 3/2001 | Batra et al. | 438/180 |
| 6,207,507 B1 | 3/2001 | Wang | |
| 6,238,988 B1 | * 5/2001 | Hsiao et al. | 438/305 |
| 6,251,737 B1 | 6/2001 | Lee | |
| 6,259,142 B1 | 7/2001 | Dawson et al. | |
| 6,312,995 B1 | 11/2001 | Yu | |
| 6,555,858 B1 | * 4/2003 | Jones et al. | 257/295 |
| 6,661,057 B1 | * 12/2003 | Dawson et al. | 257/336 |

* cited by examiner

Primary Examiner—John F. Niebling
Assistant Examiner—Ron Pompey
(74) Attorney, Agent, or Firm—Scully, Scott, Murphy & Presser; Joseph P. Abate, Esq.

(57) ABSTRACT

A low-GIDL current MOSFET device structure and a method of fabrication thereof which provides a low-GIDL current. The MOSFET device structure contains a central gate conductor whose edges may slightly overlap the source/drain diffusions, and left and right side wing gate conductors which are separated from the central gate conductor by a thin insulating and diffusion barrier layer.

12 Claims, 3 Drawing Sheets

LOW-GIDL MOSFET STRUCTURE AND METHOD FOR FABRICATION

BACKGROUND OF THE INVENTION

The present invention relates generally to a low-GIDL (Gate-Induced Drain Leakage) current MOSFET device structure and a method of fabrication thereof.

As device geometries shrink, reliability problems due to Gate-Induced Drain Leakage (GIDL) current force operation at voltages which are lower than desired for best device performance.

The GIDL current results from the generation of electron-hole pairs in the surface drain depletion region of a field effect transistor along the area where the gate conductor overlaps the drain diffusion region, when the device is biased such that the drain potential is more positive (greater than +1V) than the gate potential in an NMOSFET, and when the gate potential is more positive (greater than +1V) than the drain potential in a PMOSFET.

SUMMARY OF THE INVENTION

The present invention provides a low-GIDL current MOSFET device structure and a method of fabrication of a low-GIDL current MOSFET device which provides a low-GIDL current which is reduced relative to conventional MOSFET devices. The MOSFET device structure contains a central gate conductor whose edges may slightly overlap the source/drain diffusions, and side wing gate conductors which are separated from the central gate conductor by a thin insulating and diffusion barrier layer.

For an NMOSFET device the side-wing gate conductors are preferably made of N+ polysilicon, and for a PMOSFET device the side-wing gate conductors are preferably made of P+ polysilicon. The central gate conductor region may be P+ poly if a high-Vt (threshold voltage) NMOSFET is desired (as in a DRAM application), or N+ poly if a low-Vt NMOSFET is needed for enhanced performance (PFETs would use complementary doping). The side wing gate conductors and the central gate conductor are strapped together by an overlying metallic sidewall conductive layer. Furthermore, the gate insulator thickness under the central gate conductor and under the side wing conductors are independently specifiable. This allows the gate insulator under the side conductors to be preferably thicker under the central conductor.

BRIEF DESCRIPTION OF THE DRAWINGS

The foregoing objects and advantages of the present invention for a low-GIDL MOSFET and method for fabrication may be more readily understood by one skilled in the art with reference being had to the following detailed description of several embodiments thereof, taken in conjunction with the accompanying drawings wherein like elements are designated by identical reference numerals throughout the several views, and in which:

FIG. 1 illustrates the device after the MOSFET gate electrode polysilicon deposition has been patterned by standard lithography and RIE processes.

FIG. 2 illustrates the device after an anisotropic dielectric deposition such as HDP is used to form an offset film on the horizontal surfaces.

FIG. 3 illustrates the device after a conductive diffusion barrier (i.e. WN, TiN) is deposited and a metallic spacer such as CVD W/WN spacer is formed along the sidewall of the PC.

FIG. 4 illustrates the device after the offset film HDP dielectric is stripped to form hanging spacers.

FIG. 5 illustrates the device after the polysilicon and silicon substrate is oxidized selectively to the W metal spacer.

FIG. 6 illustrates the device after a thin LPCVD polysilicon is deposited to fill the divot formed by the undercut region below the W spacer.

FIG. 7 shows the device after the thin LPCVD silicon is removed from the field regions by an isotropic etch (like a strap etch), with the thin LPCVD silicon remaining in the sidewall divots.

FIG. 8 shows the device after the S/D extensions/halos and spacers are formed by conventional processes such as an ion implantation.

FIG. 9 shows the device after salicide is formed by conventional processes.

DETAILED DESCRIPTION OF THE INVENTION

FIGS. 1–9 illustrate a method of fabrication of a low-GIDL MOSFET (metal oxide semiconductor field effect transistor) device pursuant to the teachings of the present invention.

Figure 1:
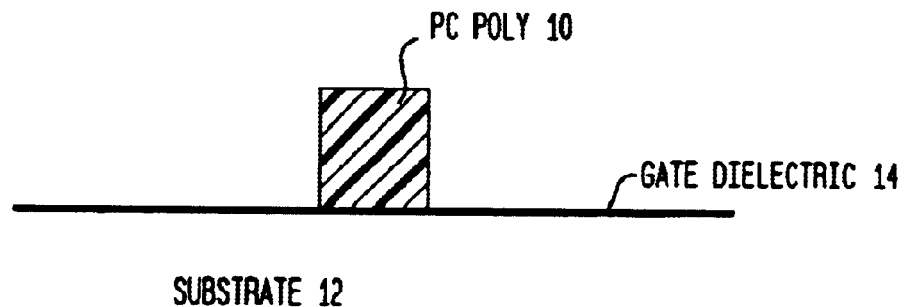
FIGS. 1–9 illustrate a method of fabrication of a low-GIDL MOSFET device pursuant to the teachings of the present invention.

FIG. 1 illustrates the device after the MOSFET primary/main central electrode polysilicon deposition 10 has been patterned by standard lithography and RIE (reactive ion etch) processes on a substrate 12 covered by a gate dielectric 14.

The gate PC (poly crystal) poly may be selectively doped prior to etching. In the illustrate embodiment, the gate 10 is doped with a P-type impurity to produce a high-Vt (threshold voltage) surface channel NFET or a low-Vt buried channel NFET.

Figure 2:
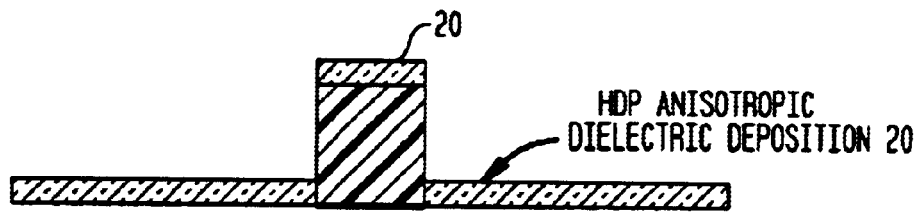

FIG. 2 illustrates the device after an anisotropic dielectric deposition 20 such as HDP (high-density plasma), preferably oxide, is used to form an offset film such as silicon dioxide on the horizontal surface.

Figure 3:
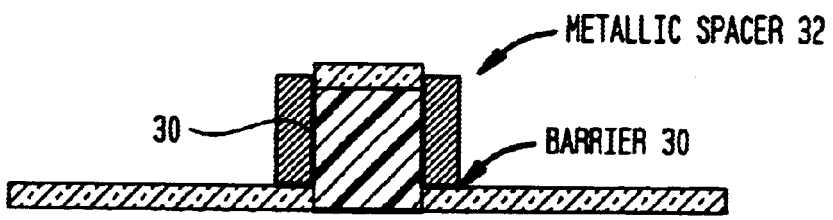

FIG. 3 illustrates the device after a conductive diffusion barrier 30 (i.e. WN (tungsten/tungsten/nitride) TiN- to prevent a reaction between the metal of the sidewall and the gate poly) is deposited and a metallic spacer 32 such as CVD (chemical vapor deposition), and a tungsten/tungsten nitride spacer is formed along the sidewall of the PC using CVD and anisotropic RIE.

The metallic sidewall spacer 32 prevents a rectifying junction from being formed between the gate electrode polysilicon 10 and the subsequently formed sidewall divot polysilicon gate extensions 70.

Figure 4:
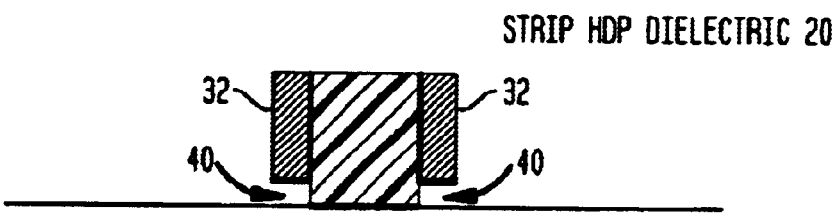

FIG. 4 illustrates the device after the offset film HDP dielectric 20 is stripped to form hanging space at 40.

Figure 5:
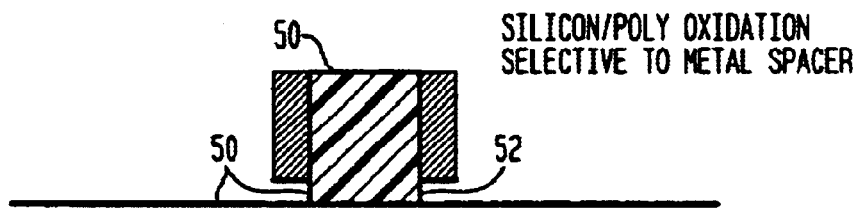

FIG. 5 illustrates the device after the polysilicon and silicon substrate is oxidized at 50 and 52 selectively to the W metal spacer (see for example S. Iwata et al., IEEE Trans. Electron Devices, ED-31, p. 1174 (1984)). The sidewall of the exposed polysilicon gate electrode is oxidized at 52 and the oxide barrier provides an insulating barrier to prevent a junction from being created because of the different work functions of the n+ gate side wing gate conductor 70 and the p+ central gate conductor poly 10.

Figure 6:
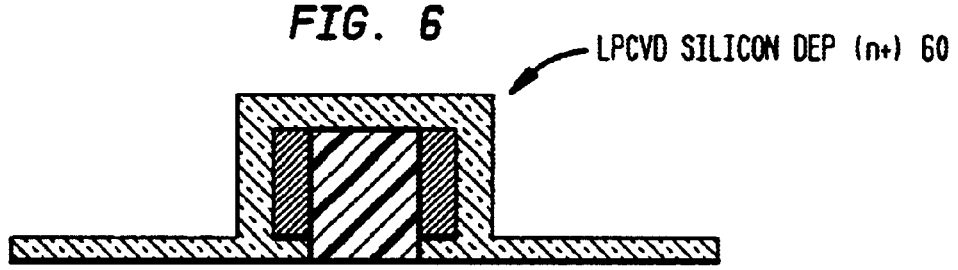

FIG. 6 illustrates the device after a thin LPCVD (low pressure chemical vapor deposition) polysilicon 60 is deposited to fill the divot formed by the undercut region 40 below the W spacer.

The thin LPCVD polysilicon 60 may be deposited doped or undoped. If doped, its doping polarity is opposite to that of the S/D diffusions. If deposited undoped, the thin LPCVD ppoly may be doped using any one, or combination of, known methods, such as low energy angled ion implantation, plasma immersion, gas phase doping, or solid source doping. Alll doping techniques would utilize a lithographically-defined block masking layer (oxide or nitride) to differentiate between NFETs and PFETs.

Figure 7:
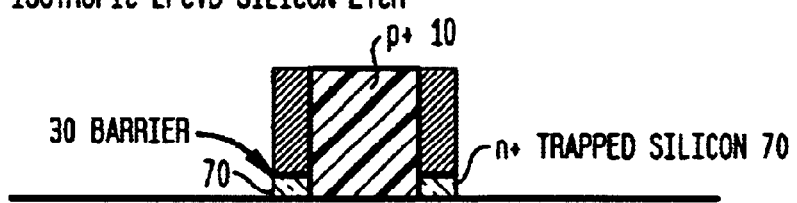

FIG. 7 shows the device after the thin LPCVD silicon is removed from the field regions by an isotopic etch as chemical dry etching (CDE) using F1 or C1 radicals (like a strap etch), with the thin LPCVD silicon remaining in the sidewall divots at 40 to from the left and right side wing gate conductors of the low-GIDL MOSFET.

Figure 8:
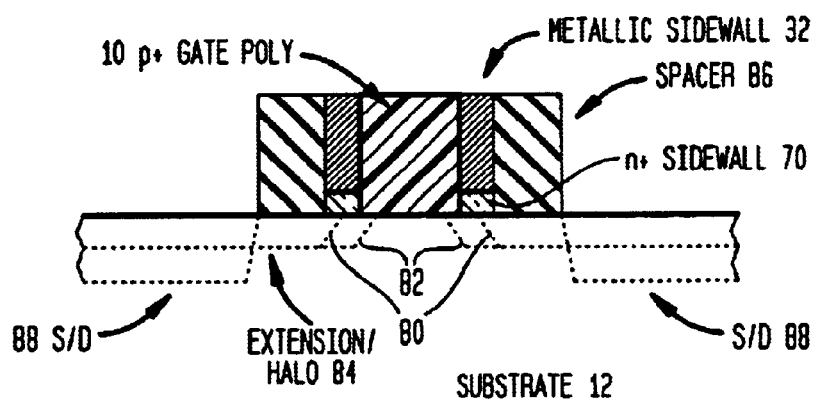

FIG. 8 shows the device after the S/D 88 extensions/halos 84 and spacers 86 are formed by conventional processes including tilted and non-tilted ion implantation. The source and drain regions are heavily doped regions, while the extension/halo region are lightly doped, and in a first embodiment slightly overlap the side wing gate conductors at 80, and in a second embodiment slightly overlap the central gate conductor at 82.

Figure 9:
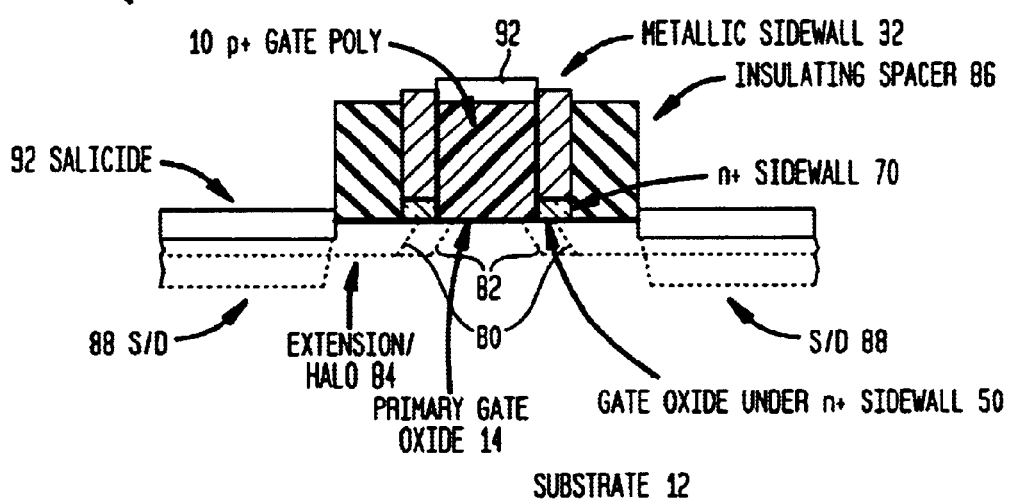

FIG. 9 shows the device after salicide 92 is formed by conventional processes.

The described method of fabrication produces a low-GIDL current MOSFET device having a central gate conductor whose edges may slightly overlap the source/drain diffusions, and side wing gate conductors which are separated from the central gate conductor by a thin insulating and diffusion barrier layer.

For an NMOSFET device the side wing gate conductors are preferably made of N+ polysilicon, and for a PMOSFET device the side wing gate conductors are preferably made of P+ polysilicon. The central gate conductor region may be P+ poly if a high Vt (threshold voltage) NMOSFET is desired (as in a DRAM application), or N+ poly if a low Vt NMOSFET is needed for enhanced performance (PFETs would use complementary doping).

The side wing gate conductors and the central gate conductor are strapped together by the overlying metallic sidewall conductive layer. Furthermore, the gate insulator GI thickness under the central gate conductor and under the side wing conductors are independently specifiable. This allows the gate insulator under the side conductors to be preferably thicker under the central conductor.

The interdiffusion between counterdoped LPCVD divot regions at the edges of the gate electrode and the gate electrode doping is suppressed by the sidewall oxide barrier. An electrical contact between the counterdoped divots and the gate electrode is provided by the metal spacers.

Simulations have been conducted to investigate the extent of a bird's beak formation under the edge of the central gate conductor, due to the regrowth of the gate oxide for the outer gate conductors (N+sidewall). The simulations involved the geometry of the edge of the central gate conductor prior to the regrowth of the second gate oxide (for the N+ sidewall gate conductors), with a 30A gate oxide existing under the central gate at this point in the process. The structure was then subjected to a typical gate oxidation cycle (950C, 150s, RTO, 100% dry O2) to grow 30A of oxide on the surface of the substrate in the region which will subsequently contain the outer N+ gate conductor segments, with the result that negligible bird's beaking occurred. Clearly, the bird's beak is very minimal and would pose no concern for the operability of the device.

Even if a large bird's beak were formed, the 1.1V workfunction shift of the N+ outer gate region with respect to the P+ inner gate region would result in inversion first occurring in the out gate regions. Thus the channel current would be dominated by the central gate region, which has the highest Vt, minimizing any effects that a bird's beak would have on channel current.

The present invention provides a method of fabricating a low gate induced leakage current (GIDL) MOSFET device comprising the steps of forming an offset film on horizontal surfaces of a patterned central gate conductor and surrounding substrate areas, preferably by using an anisotropic dielectric deposition to form the offset film on the horizontal surfaces of the patterned central gate conductor and the surrounding substrate areas. The patterned central gate conductor is preferably formed by depositing polysilicon on a substrate covered by a gate dielectric and then patterning the MOSFET central gate conductor by lithography and reactive ion etch processes.

The process then continues with depositing a conductive diffusion barrier on sidewalls of the central gate conductor, and then forming metallic spacers over the conductive diffusion barrier on the sidewall of the central gate conductor, after which the offset film is stripped to form hanging metallic spacers over undercut regions.

The process then continues with oxidizing the central gate conductor beneath the hanging metallic spacers to prevent a rectifying junction from being formed between the central gate conductor and subsequently formed left and right side wing gate conductors, and then depositing a polysilicon layer to fill the undercut regions below the hanging metallic spacers, after which the polysilicon layer is removed by an isotropic etch while leaving the polysilicon layer remaining in the undercut regions below the hanging metallic spacers to form the left and right side wing gate conductors.

The process then continues to completion by forming source and drain extensions/halos and spacers, and then forming salicide on conductors. In preferred embodiments, the central gate conductor and the left and right side wing gate conductors are preferably formed of doped polysilicon.

The process as described provides a MOSFET device with a low gate-induced leakage (GIDL) current which comprising a source diffusion region, a drain diffusion region, and a central gate. The central gate comprises a central gate conductor, a left side wing gate conductor and a right side wing gate conductor, wherein each of the left side wing gate conductor and the right side wing gate conductor is separated from the central gate conductor by a thin insulating and diffusion barrier layer.

The left and right lateral edges of the central gate conductor can overlap one of the source diffusion region and the drain diffusion region. The left and right lateral edges of the left and right side wing gate conductors can also overlap one of the source diffusion region and the drain diffusion region.

The central gate conductor and the left and right side wing gate conductors are strapped together by an overlying metallic sidewall conductive layer. The overlying metallic sidewall conductive layer includes left and right metallic sidewall spacers formed along left and right sidewalls of the central gate conductor to prevent a rectifying junction from being formed between the central gate conductor and the left and right side wing gate conductors. The left and right metallic sidewall spacers are separated from the central gate conductor by a conductive diffusion barrier layer.

The thickness of a gate insulator under the left and right side wing conductors can be independently specifiable such that it can be thicker than the thickness of a gate insulator under the central conductor.

While several embodiments and variations of the present invention for a low-GIDL MOSFET and method for fabrication are described in detail herein, it should be apparent that the disclosure and teachings of the present invention will suggest many alternative designs to those skilled in the art.

Having thus described our invention, what we claim as new and desire to secure by Letters Patent is:

1. A MOSFET device which provides a low gate-induced leakage (GIDL) current comprising:
   a source diffusion region, a drain diffusion region, and a central gate;
   the central gate comprising a central gate conductor, a left side wing gate conductor and a left metallic sidewall, and a right side wing gate conductor and a right metallic sidewall, wherein each of the left metallic sidewall and the right metallic sidewall is separated from the central gate conductor by a conductive diffusion barrier layer.

2. The MOSFET device of claim 1, wherein left and right lateral edges of the central gate conductor overlap one of the source diffusion region and the drain diffusion region.

3. The MOSFET device of claim 1, wherein left and right lateral edges of the left and right side wing gate conductors overlap one of the source diffusion region and the drain diffusion region.

4. The MOSFET device of claim 1, wherein the central gate conductor and the left and right side wing gate conductors are electrically connected together by the left and right metallic sidewalls.

5. The MOSFET device of claim 1, wherein the thickness of a gate insulator under the left and right side wing conductors is thicker than the thickness of a gat insulator under the central conductor.

6. The MOSFET device of claim 1, comprising an NMOSFET device, wherein each of the left side wing conductor and the right side wing gate conductor is formed of N+ polysilicon.

7. The MOSFET device of claim 1, comprising a PMOSFET device, wherein each of the left side wing conductor and the right side wing gate conductor is formed of P+ polysilicon.

8. The MOSFET device of claim 1, wherein the central gate conductor is formed of P+ polysilicon to form a high Vt (threshold voltage) NMOSFET.

9. The MOSFET device of claim 1, wherein the central gate conductor is formed of N+ polysilicon to form a low Vt (threshold voltage) NMOSFET.

10. The MOSFET device of claim 1, wherein the central gate conductor is formed of N+ polysilicon to form a high Vt (threshold voltage) PMOSFET.

11. The MOSFET device of claim 1, wherein the central gate conductor is formed of P+ polysilicon to form a low Vt (threshold voltage) PMOSFET.

12. The MOSFET device of claim 1, wherein the central gate conductor is formed of P+ polysilicon to form a low Vt (threshold voltage) PMOSFET.

* * * * *